United States Patent
Elias-Palacios et al.

(10) Patent No.: US 10,141,149 B2
(45) Date of Patent: Nov. 27, 2018

(54) THIN FILM FUSE

(71) Applicant: Continental Automotive Systems, Inc., Auburn Hills, MI (US)

(72) Inventors: Sergio A. Elias-Palacios, Rochester Hills, MI (US); Blendi Sullaj, Saint Clair Shores, MI (US); James Poirier, Sterling Heights, MI (US); Thomas Schaffer, Shelby Township, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/419,336

(22) Filed: Jan. 30, 2017

(65) Prior Publication Data

US 2018/0218869 A1    Aug. 2, 2018

(51) Int. Cl.
*H01H 85/055* (2006.01)
*H01H 85/046* (2006.01)
*H01H 85/08* (2006.01)
*H05K 1/18* (2006.01)

(52) U.S. Cl.
CPC ........ *H01H 85/055* (2013.01); *H01H 85/046* (2013.01); *H01H 85/08* (2013.01); *H05K 1/181* (2013.01); *H05K 2201/10181* (2013.01)

(58) Field of Classification Search
CPC .... H01H 85/055; H01H 85/046; H01H 85/08; H05K 1/181; H05K 2201/10181
USPC .......................................................... 337/297
See application file for complete search history.

(56) References Cited

U.S. PATENT DOCUMENTS

| | | | | |
|---|---|---|---|---|
| 4,198,617 A | * | 4/1980 | Hara | H01H 37/761 337/403 |
| 4,652,848 A | * | 3/1987 | Hundrieser | H01H 85/046 337/297 |
| 5,000,662 A | | 3/1991 | Yamamoto et al. | |
| 6,198,376 B1 | * | 3/2001 | Ishikawa | H01H 37/761 337/159 |
| 6,222,438 B1 | * | 4/2001 | Horibe | H01H 37/76 29/623 |
| 6,445,277 B1 | * | 9/2002 | Ishikawa | H01C 7/12 337/290 |
| 8,705,249 B2 | * | 4/2014 | Luppold | H01H 85/046 174/164 |
| 9,266,728 B2 | * | 2/2016 | Hood | B01J 7/00 |
| 9,899,171 B2 | * | 2/2018 | Aurich | H01H 37/32 |
| 2010/0109833 A1 | * | 5/2010 | Knab | H01H 37/761 337/413 |
| 2011/0051388 A1 | * | 3/2011 | Luppold | H01H 85/046 361/783 |

FOREIGN PATENT DOCUMENTS

CN    1619749 A    5/2005
DE    9414019 U1   11/1994

OTHER PUBLICATIONS

International Search Report and Written Opinion dated Apr. 24, 2018 from corresponding International Patent Application No. PCT/US2018/015857.

* cited by examiner

*Primary Examiner* — Anatoly Vortman

(57) ABSTRACT

A thin film fuse is formed by two substantially planar conductors, separated from each other by a thin gap. The conductors and gap are over-coated with a thin, conductive material having a surface tension when melted, great enough to pull the conductive material out of the gap.

5 Claims, 5 Drawing Sheets

THIN FILM FUSE

BACKGROUND

A fuse is an over-current protective device having a circuit-opening link that is heated and severed by the passage of current through it. Fuses have been used for decades to limit the amount of current that can flow through a conductor or load.

Although prior art fuses have proven to be reliable, they are problematic when used with printed circuit boards because the housings in which such devices are mounted tend to require relatively large areas. A fuse that is at least as reliable as prior art devices but which takes up less space would be an improvement over the prior art.

DETAILED DESCRIPTION

It is well known that the mutual attraction of particles of a liquid, endows its surface with properties that resemble a stretched elastic membrane. A liquid thus acts as though its surface were subjected to a tangential tension. The magnitude of that stress, when the substance bounding the surface is a vapor of the liquid, is called "surface tension."

When a metal is molten, i.e. above its melting temperature, the forces acting on the molten metal are gravity and the intermolecular attractions that manifest themselves in the phenomena known as surface tension. It therefore follows that the behavior of molten metal will be closely related to its surface tension. When a metal melts, surface tension of the molten metal will pull the molten metal together to form a sphere or a spherical-like shape.

Figure 1:
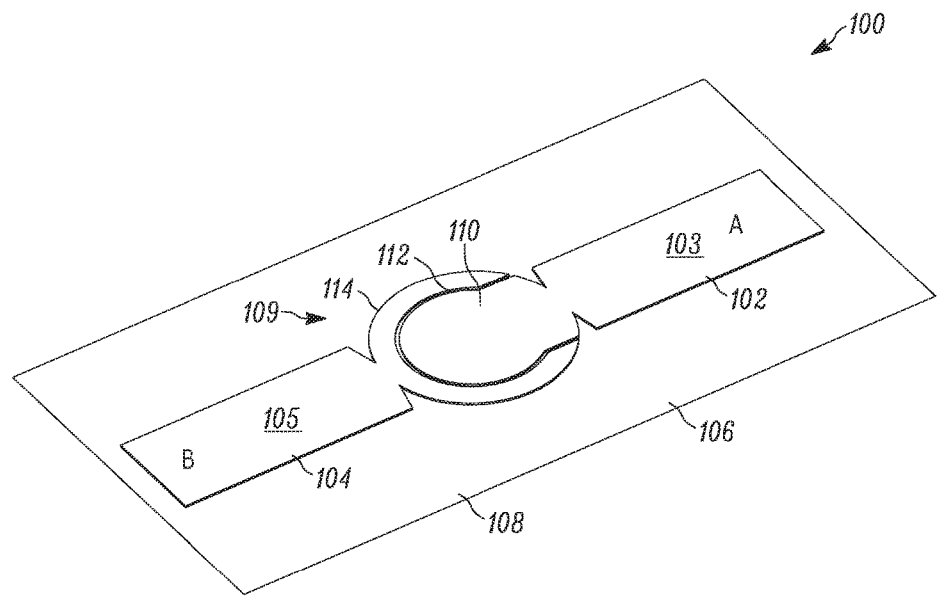
FIG. 1 depicts two copper conductors deposited onto a small or localized area of a thin, non-conductive substrate such as a conventional printed circuit board, and which form part of a thin film fuse.

FIG. 1 depicts two copper conductors deposited onto a small or localized area of a thin, non-conductive substrate such as a conventional printed circuit board, and which form part of a thin film fuse 100. The portions of fuse 100 shown in FIG. 1 comprise two substantially planar copper conductors identified by reference numerals 102 and 104. They are deposited onto the top surface 106 of a substantially planar substrate 108 using conventional printed circuit board fabrication techniques.

The first conductor 102 has a substantially rectangular-shaped first portion 103 from which extends a second portion 110, which has a shape reminiscent of a key-hole or tunnel.

The keyhole or tunnel-shaped portion 110 is bounded by a narrow gap 112 that separates the keyhole or tunnel-shaped portion 110 from a substantially "oarlock-shaped" second portion 114 of the second copper conductor 104. The oarlock-shaped portion 114 can also be considered to be substantially annulus-shaped.

Figure 2:
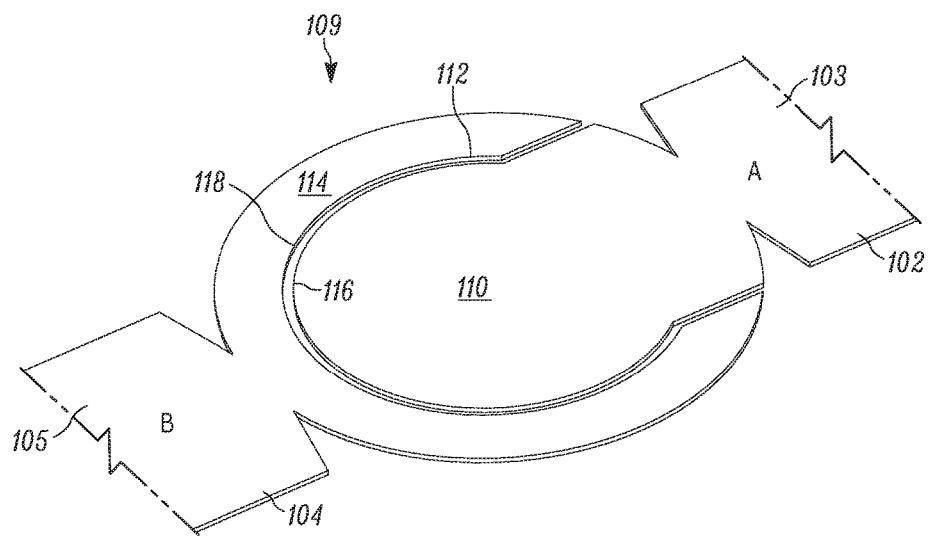
FIG. 2 is an enlargement of part of the structure shown in FIG. 1.

FIG. 2 depicts an enlargement of a "central portion" 109 of the first and second conductors 102 and 104. The separation gap 112 is considered herein as being a space or distance between peripheral edges 116 and 118 of the inner, tunnel-shaped portion 110 and the outer, oarlock-shaped portion 114 of the two conductors 102 and 104. Those of ordinary skill in the art should recognize that the gap 112 has a length substantially equal to the length of the peripheral edges 116 and 118 which "face" each other.

Figure 3:
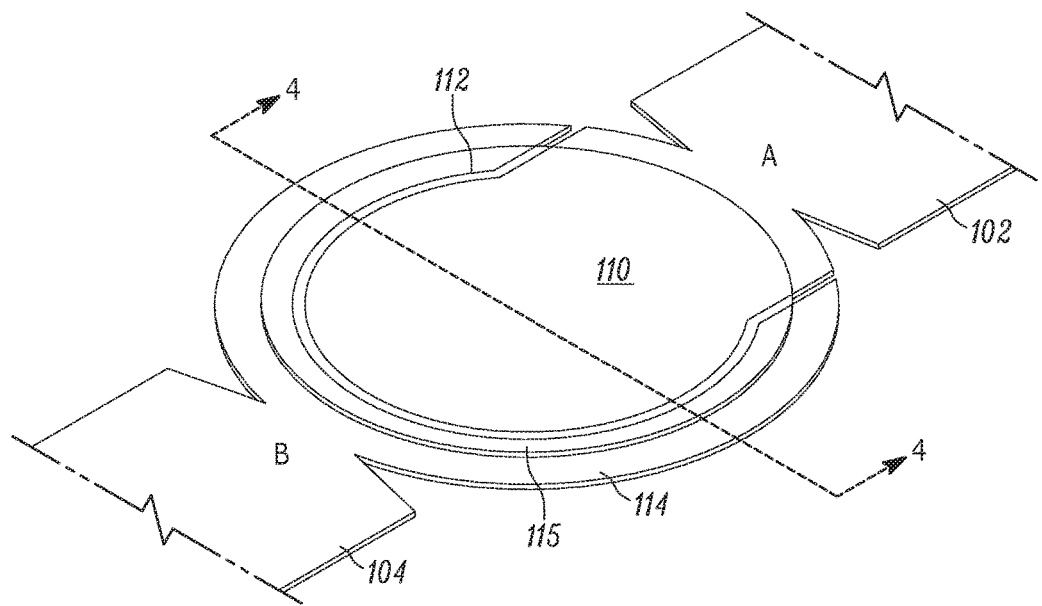
FIG. 3 is a perspective view of the structure shown in FIG. 1 and FIG. 2, overlaid with a thin metallic film thus forming a thin film fuse.

Referring now to FIG. 3, which is a perspective view of the structure shown in FIG. 1 and FIG. 2, overlaid with a thin metallic film, the central, keyhole or tunnel-shaped portion 110 of the first conductor 102 and the surrounding, oarlock-shaped portion 114 of the second conductor 104 are overlaid with a thin metallic film 115. The shape of the film 115 is substantially circular and is deposited using conventional thin film deposition techniques. The thin film 115 can also be deposited using screen printing.

Figure 4:
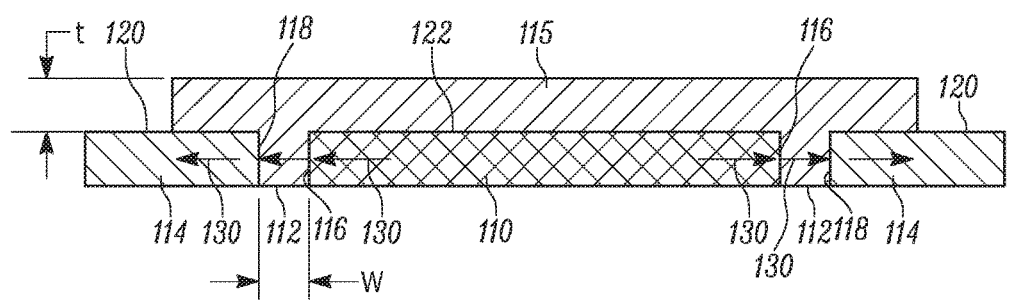
FIG. 4 is a cross section of the thin film fuse device shown in FIG. 3 taken through section lines 3-3.

As best in seen FIG. 4, which is a cross-sectional view of FIG. 3 taken through section lines 4-4, the thin metallic film 115 covers the top surface 120 of the outer oarlock-shaped portion 114 and the top surface 122 of the inner, keyhole-shaped portion 110. The material from which the thin metallic film 115 is made also fills the gap 112 between the peripheral edges 116 and 118.

The width, W, of the gap 112 is considered to be the horizontal separation distance between the peripheral edges 116 and 118 of the two conductor sections 110, 114. The vertical thickness of the thin film, t, the length of the gap 112 and its width, W, thus determine the volume and cross-sectional area of an electric conductor through which current 130 can flows from one conductor section 110 to the other 114 and vice versa.

Those of ordinary skill in the electrical arts know that current flowing through a conventional conductor (non-superconducting) will cause the conductor's temperature to rise or increase. When the magnitude of current 130 flowing through the thin film 115 gets large enough to heat the material from which the thin metallic film 115 is made, the temperature increase due to increasing current will eventually cause the metallic film 115 to melt. When the metallic thin film melts surface tension of the material causes it to withdraw or pull out of the gap 112, opening the connection between the two conductors 102, 104. At least one advantage of the thin film device is that after the material 115 is melted and the fuse thus "blown," it cannot be replaced by the same or a larger fuse. The thin film fuse is thus non-field replaceable, i.e., capable of being replaced where it is used, nor is it field repairable, i.e., capable of being repaired where it is used. "Over-fusing" a conductor or load is also thus prevented.

Figure 5:
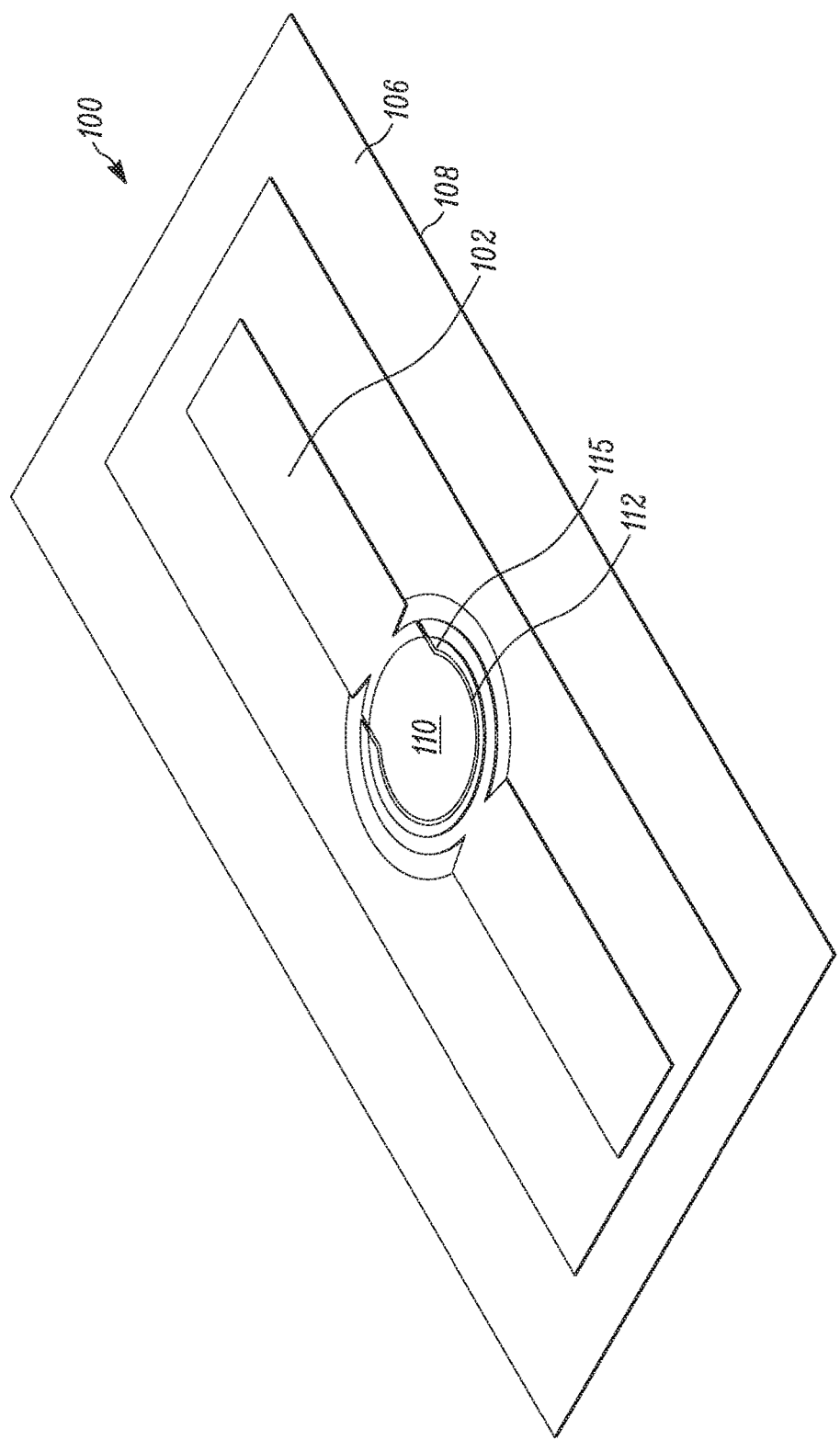
FIG. 5 is a perspective view of an isolated portion of a conventional circuit board on which a thin metal film fuse is deposited.
Figure 6A:
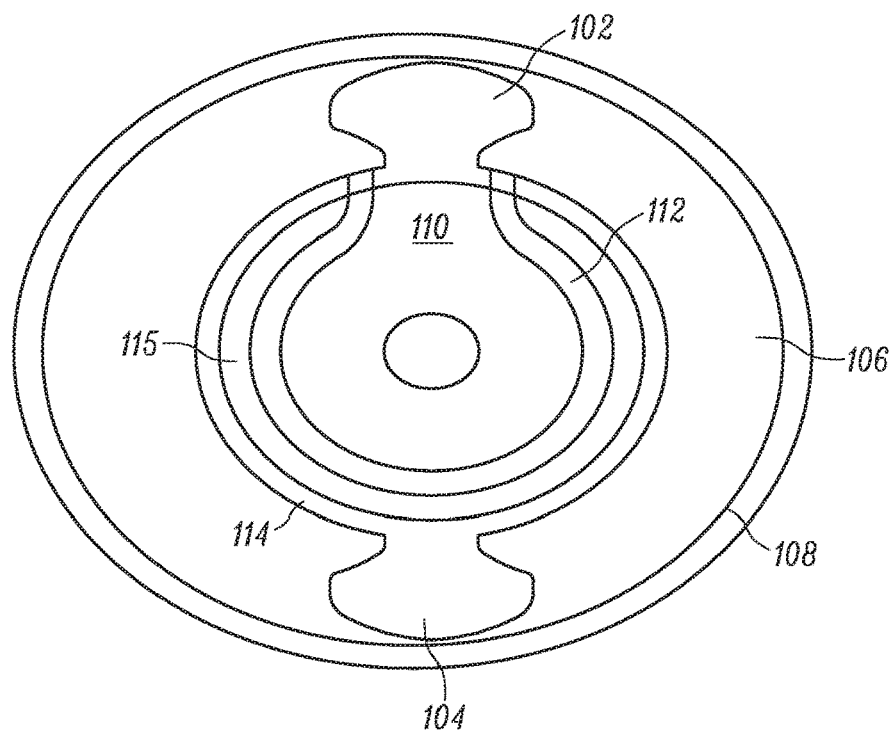
FIG. 6A is a top view of a thin film fuse prior to being blown.

FIG. 5, is a perspective view of a thin film fuse 100 in a closed state, and located on the top surface of a printed circuit board. FIG. 6A is an isolated view of the thin film fuse 100, showing the thin metallic film material 115 extending over a portion of the central planar conductor 110 and extending over the gap 112. As current through the material from which the thin metallic film 115 is made increases, the temperature of the thin metallic film 115 will increase and eventually melt.

The material from which the thin metallic film 115 is made is selected to have a surface tension in its molten state, great enough to pull the molten metallic off the surface 106 of the substrate 108 and onto the central portion 110 of one of the first conductor 102

Figure 6B:
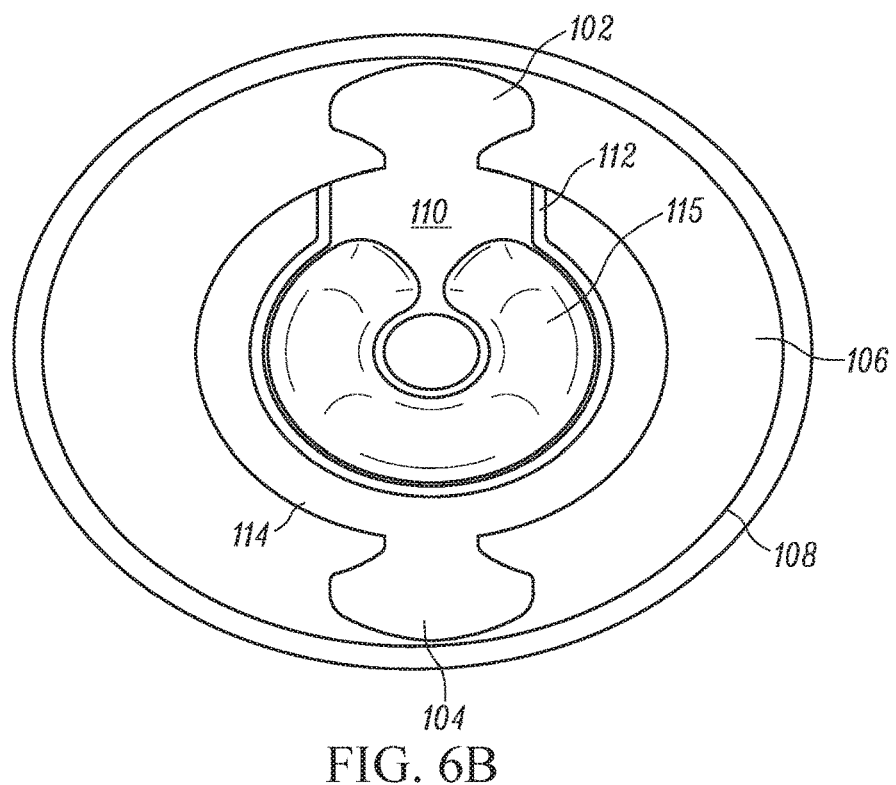
FIG. 6B is a top view of the same thin film fuse shown in FIG. 6A, after being or opened or "blown" by excessive current flow through the thin metal film.

FIG. 6B shows the thin metallic film material 115 after melting and after the material's surface tension pulls it back and out of the gap 112 thereby cutting off electric current that was previously flowing through the gap via the solid thin film metal material.

Those of ordinary skill in the art should recognize that the surface 106 on which the thin metallic film is deposited should be selected to not reduce the surface tension of the molten metal below a value necessary to pull the molten metal out of the gap 112 by surface tension. The surface of the substrate should thus be a non-wetting surface relative to the molten fusible material. The width of the gap 112 should also not be so wide that surface tension of the molten metal is not able to pull the molten metal out of the gap 112.

In a preferred embodiment, the peripheral edges of the planar conductors are preferably concentric circles to uniformly distribute surface tension force. Other shapes can of course be used but non-circular gaps 112 will create localized areas where surface tension forces are non-uniform or irregular.

In alternate embodiments, the shapes of the two conductors can be concentric similar ellipses, regular or irregular similar polygons. For purposes of clarity, the word "similar" means having identical or nearly identical shapes but different only in size.

The space between the concentric circles or other shaped conductors is preferably quite small and preferably about 200 micrometers.

The planar conductors which define those edges are also quite thin, typically about thirty-five micrometers. The thin metallic film thickness is about 100 micrometers.

The thin metallic film, which is essentially a fusible link, can be electro-plated, deposited by vapor or screen printed, depending in part on the amount of current that the thin film fuse needs to be able to carry. The current, measured in amperes, at which the fusible link will open, will be dependent upon the overall cross-sectional area of the fusible link material, as well as its electrical resistance and will thus be dependent upon the length of the gap 112 between the conductors. That length is substantially equal to the lengths of the peripheral edges that face each other.

Figure 7:
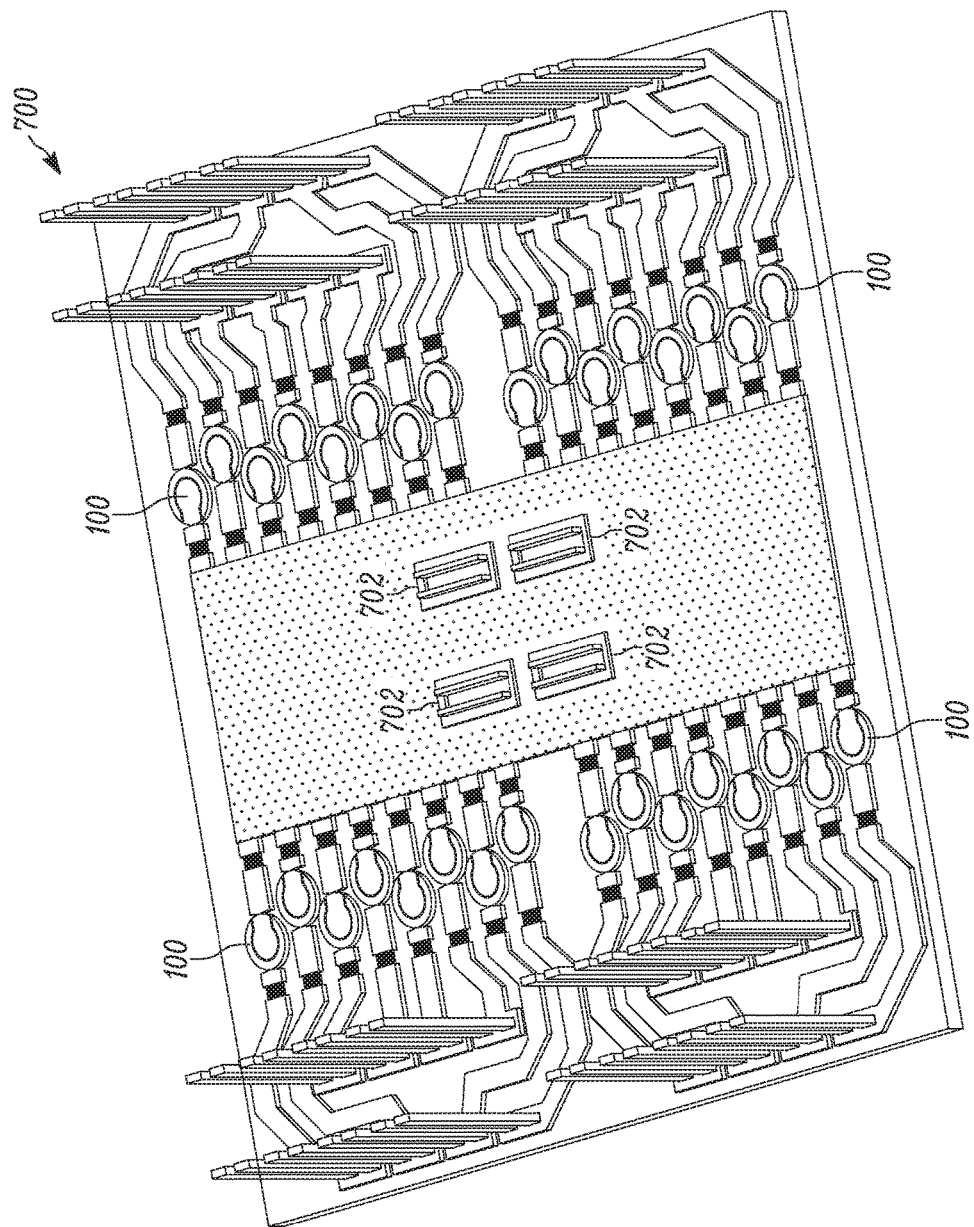
FIG. 7 is a perspective view of a circuit board having an array or matrix of thin film fuses.

Finally, FIG. 7 is a perspective view of a circuit board 700 having an array or matrix of thin film fuses 100, each of which has a structure as described above. One or more of fuses 100 limit electric current provided to electrical loads or devices 702 on the circuit board and to which one or more fuses are coupled between the devices 702 and an electrical current source, not shown.

"Replace" is considered herein to mean, to put something new or different in the place of something worn out, damaged or destroyed. Non-replaceable is considered to mean incapable of being replaced by something new or different.

As can be seen in FIG. 7, multiple fuses 100, the surface area sizes of which are quite small relative to conventional prior art fuses, can be placed side-by-side on a single printed circuit board 700. Thin film fuses 100 can thus be provided on the circuit board 700 to provide non-replaceable, over-current protection to numerous or even every electrical device 702 on the printed circuit board 700.

The foregoing description is for purposes of illustration only. The true scope of the invention is set forth in the following claims.

What is claimed is:

1. A thin film fuse comprising:
a non-conductive substrate having a surface;
first and second substantially planar conductors, each conductor having a corresponding thickness and a peripheral edge, the planar conductors being disposed on the substrate's surface, the first conductor having a substantially rectangular-shaped first portion from which extends a substantially key-hole shaped second portion, the second conductor being substantially oarlock-shaped and partially surrounding the substantially key-hole shaped second portion of the first substantially planar conductor, the substantially oarlock-shaped portion having a break through which extends a part of the substantially rectangular-shaped first portion of the first conductor, the peripheral edges of the substantially key-hole shaped second portion and the substantially oarlock-shaped second conductor being separated from each other by a substantially C-shaped gap having a predetermined substantially uniform-width, the gap being located between the key-hole shaped portion and the oarlock-shaped portion, the gap also having a predetermined gap length;
a thin metallic film disposed on the top of the substantially key-hole shaped second portion and the substantially oarlock-shaped second conductor and extending across the substantially uniform width gap.

2. The thin film fuse of claim 1, wherein the peripheral edges are portions of concentric circles.

3. The thin film fuse of claim 1, wherein the gap has the predetermined width of about two hundred micrometers and wherein at least one of the planar conductors has a thickness of about thirty-five micrometers and where the thin metallic film predetermined thickness is about one-hundred micrometers.

4. The thin film fuse of claim 1, wherein the thin metallic film is an electroplated film.

5. The thin film fuse of claim 1, wherein the thin metallic film is a vapor deposition film.

* * * * *